United States Patent [19]

Shiga

[11] Patent Number: 5,602,501
[45] Date of Patent: *Feb. 11, 1997

[54] MIXER CIRCUIT USING A DUAL GATE FIELD EFFECT TRANSISTOR

[75] Inventor: Nobuo Shiga, Yokohama, Japan

[73] Assignee: Sumitomo Electric Industries, Ltd., Japan

[ * ] Notice: The term of this patent shall not extend beyond the expiration date of Pat. No. 5,389,807.

[21] Appl. No.: 341,223

[22] Filed: Dec. 5, 1994

Related U.S. Application Data

[63] Continuation-in-part of Ser. No. 109,538, Aug. 20, 1993, Pat. No. 5,444,399, and Ser. No. 110,937, Aug. 24, 1993, Pat. No. 5,389,807.

[30] Foreign Application Priority Data

Sep. 3, 1992 [JP] Japan ..................................... 4-235946
Sep. 11, 1993 [JP] Japan ..................................... 5-243229

[51] Int. Cl.$^6$ ........................... H03K 3/353; H03B 19/00
[52] U.S. Cl. ........................... 327/105; 327/113; 327/355; 257/280
[58] Field of Search ..................................... 327/105, 113, 327/116, 119, 121, 355, 356, 431; 257/270, 280, 285

[56] References Cited

U.S. PATENT DOCUMENTS

| | | |
|---|---|---|
| 4,048,646 | 9/1977 | Ogawa et al. . |
| 4,264,981 | 4/1981 | Vilimek . |
| 4,308,473 | 12/1981 | Carnes . |
| 4,389,660 | 6/1983 | Decker . |
| 4,459,556 | 7/1984 | Nanbu et al. . |
| 4,511,813 | 4/1985 | Pan . |
| 4,658,220 | 4/1987 | Heston et al. ........................ 330/277 |
| 4,658,440 | 4/1987 | Pavio et al. . |
| 4,709,410 | 11/1987 | Tajima et al. . |
| 4,751,744 | 6/1988 | Pavio, Jr. . |
| 4,783,688 | 11/1988 | Shannon . |
| 4,814,649 | 3/1989 | Young . |
| 4,814,851 | 3/1989 | Abrokwah et al. . |
| 4,841,169 | 6/1989 | Tsironis . |
| 5,010,305 | 4/1991 | Shiga . |

(List continued on next page.)

FOREIGN PATENT DOCUMENTS

| | | |
|---|---|---|
| 0285206 | 10/1988 | European Pat. Off. . |
| 0492666 | 7/1992 | European Pat. Off. . |
| 0128907 | 10/1980 | Japan . |
| 0090806 | 5/1983 | Japan . |
| 0199306 | 9/1986 | Japan . |
| 0072210 | 4/1987 | Japan . |
| 0288004 | 11/1989 | Japan . |

OTHER PUBLICATIONS

Patent Abstracts of Japan, vol. 8, No. 66, (E–234) 28 Mar. 1984 & JP-A-58 215 077 (Nippon Denki K.K.) 14 Dec. 1983.

(List continued on next page.)

Primary Examiner—Timothy P. Callahan
Assistant Examiner—T. Lam
Attorney, Agent, or Firm—Beveridge, DeGrandi, Weilacher & Young, L.L.P.

[57] ABSTRACT

In a mixer circuit, a first gate electrode of a dual gate MESFET having a pulse doped structure is connected through a filter to an LO signal input terminal, and a second gate electrode of the dual gate FET is connected through a matching circuit to an RF signal input terminal. The drain electrode of the dual gate FET is connected through a low-pass filter to an output terminal. The gate bias point of the first gate electrode 25a of the dual gate FET is set in the vicinity of the pinch-off point of the mutual conductance, and the gate bias point of the second gate electrode 25b of the dual gate FET is set in the area where the mutual conductance is unvaried with increase of the gate voltage. With this arrangement, the mixer circuit is so designed that the isolation characteristic of the RF signal and the LO signal is excellent, and a stable operational characteristic is obtained.

54 Claims, 10 Drawing Sheets

U.S. PATENT DOCUMENTS

| | | |
|---|---|---|
| 5,047,816 | 9/1991 | Cuevas . |
| 5,083,050 | 1/1992 | Vasile . |
| 5,146,182 | 9/1992 | Shiga . |
| 5,164,686 | 11/1992 | Shiga . |
| 5,196,359 | 3/1993 | Shih et al. . |
| 5,224,218 | 6/1993 | Shiga . |
| 5,263,198 | 11/1993 | Geddes et al. . |
| 5,302,840 | 4/1994 | Takikawa ............................ 257/194 |
| 5,391,512 | 2/1995 | Shiga . |
| 5,396,132 | 3/1995 | Shiga . |

OTHER PUBLICATIONS

Patent Abstracts of Japan, vol. 007, No. 182 (E–192) 11 Mar. 1983 & JP–A–58 087 875 (Hitachi Seisakushio KK) 25 May 1983.

Patent Abstracts of Japan, vol. 013, No. 439 (E–827) 3 Oct. 1989 & JP–A–01 116 569 (Hitachi Ltd) 30 Jun. 1989.

Patent Abstracts of Japan, vol. 8, No. 44 (E–229) 25 Feb. 1984 & JP–A–58 201 375 (Nippon Denki K.K.) 24 Nov. 1983.

Patent Abstracts of Japan, vol. 6, No. 123 (E–117) (1001) 8 Jul. 10982 & JP–A–57–052 174 (Nippon Denki K.K.) 27 Mar. 1982.

Patent Abstracts of Japan, vol. 014, No. 346 (E–0956) 26 Jul. 1990 & JP–A–02 119 146 (Sony Corp) 7 May 1990.

Funkschau, vol. 6, No. 21 article entitled "Applikationen für Satelliten–Receiver", by Roland Reuschle and Prof. Harshavadar Shah, published Oct. 1989, pp. 61–65.

Electronique Radio Plans, No. 513 article entitled "Les transistors TEC á l'arsèniure de Gallium", published Aug. 1990, pp. 59–68.

Elektor Electronics, No. 158+Suppl. article entitled "GaAs FET Converter For 23 CM Amateur Television", by G. Wehrhahn, Jul.–Aug. 1988, pp. 45–49.

IEEE International Microwave Symposium DIGEST, article entitled "Design And Performance Of Dual–Gate GaAs MESFET Up–Convertor", by A. A. de Salles, May 31, 1983, pp. 440–442.

MIXER CIRCUIT USING A DUAL GATE FIELD EFFECT TRANSISTOR

RELATED APPLICATION

This is a continuation-in-part of (1) application Ser. No. 08/109,538 filed on Aug. 20, 1993, now U.S. Pat. No. 5,444,399; and (2) application Ser. No. 08/110,937 filed on Aug. 24, 1993, now U.S. Pat. No. 5,389,807.

BACKGROUND OF THE INVENTION

1. Field of the Invention

This invention relates to a mixer circuit for use in a converter (frequency converting circuit), a measuring instrument, etc.

2. Related Background Art

Through a recent attempt to rapidly develop information network system, demand for a satellite communication system has been also rapidly increased, and a frequency band has been shifted to high frequency. In this type of satellite communication system, a down converter for converting a high-frequency signal to a low-frequency signal is required, and a mixer circuit which is applied to the down converter has been also increasingly demanded. There have been conventionally utilized various types of mixer circuits, each of which uses any one of a diode, a bipolar transistor, a FET (field effect transistor), etc. as an active device thereof. An normal MESFET (Metal-semiconductor field effect transistor) or a HEMT (high electron mobility transistor) has been generally used.

SUMMARY OF THE INVENTION

In design of a mixer circuit using a FET, that is, a FET mixer circuit, a gate voltage of the FET is greatly fluctuated because an LO (local oscillation) signal is a large-amplitude signal. The variation of the gate voltage induces variation of mutual conductance $g_m$ of the FET, so that a gate/source capacitance $C_{gs}$, and thus input impedance is also varied. That is, viewing from an input side for RF (radio frequency) signals, the FET mixer circuit operates such that the input impedance of the circuit greatly varies as a time function in accordance with fluctuation of the LO signal. Therefore, design of the FET mixer circuit is difficult, and a stable operation thereof is hardly expected.

An object of this invention is to provide a mixer circuit which is stably operated with no variation of input impedance thereof.

The above and other objects will be more clearly understood from the following description.

A first embodiment of the present invention is directed to a mixer circuit using a dual gate FET as an active device, the mixer circuit comprising a radio frequency signal input terminal (called an RF input terminal as a first input terminal), a local oscillation signal input terminal (called an LO input terminal as a second input terminal), an intermediate frequency signal output terminal (called an IF output terminal as an output terminal), and a dual gate FET. The dual gate FET includes a dual gate MESFET having a pulse doped structure and equipped with first and second gate electrodes. The first gate electrode is connected to a local oscillation signal input terminal, and the second gate electrode is connected to a radio frequency signal input terminal. Further, a drain electrode formed on an upper surface of the drain region is connected to an intermediate frequency signal output terminal, and the source electrode formed on an upper surface of the source region is grounded or connected to a predetermined voltage potential (negative or positive).

The dual gate FET which is used as an active device in the mixer circuit of this invention has a pulse doped structure. The pulse doped structure means that a pulse-doped layer is formed in the substrate of this FET, the pulse-doped layer containing an impurity having a significantly larger impurity concentration level than the other layers. In particular, the impurity concentration profile which shows the impurity concentration level in the depth direction from the first and second electrodes to the bottom of the substrate is "pulse-shaped" at a predetermined depth associated to the position of the pulse-doped layer. This dual gate FET has a special characteristic that "it has a flat area where the mutual conductance is unvaried with a gate voltage", which is not observed for a normal MESFET or HEMT obtained by forming an active layer using an ion injection method. Accordingly, if a bias point for the second gate electrode is set in this area, no variation of input impedance occurs due to the RF signal itself.

Further, if the gate bias voltage of the first gate electrode of the dual gate FET is set to a value in the neighborhood of the pinch-off voltage of the mutual conductance, the frequency conversion could be performed at high conversion efficiency using non-linearity of the mutual conductance.

Still further, the FET is of a dual gate type, and thus an RF signal and an LO signal are input to different gates respectively, so that an excellent isolation characteristic is obtained.

The mixer circuit according to the present invention further comprises first bias means for supplying the first gate electrode with a gate bias voltage in the vicinity of a pinch-off voltage thereof, second bias means for supplying the second gate electrode with such a gate bias voltage such that a mutual conductance of the second gate electrode is unvaried with variation of a gate input voltage thereof, a matching circuit, disposed between the second gate electrode and the first input terminal, for matching an input impedance of the second gate electrode, a low-pass filter disposed between the drain electrode and the output terminal, and a filter, disposed between the first gate electrode and the second input terminal, for preventing the intermediate frequency signal mixed-down in the mixer circuit from leaking to an opposite side of the second input terminal.

The mixer circuit as a second embodiment of this invention further comprises a first single gate FET with a pulse-doped structure, which is disposed between the second input terminal and the first gate electrode of the dual gate FET. The first single gate FET has a gate electrode connected to the second input terminal; a drain electrode connected to the first gate electrode of the dual gate FET; and a source electrode connected to ground or a predetermined voltage potential (negative or positive).

The mixer circuit as a third embodiment of this invention further comprises a second single gate FET with a pulse-doped structure, which is disposed between the first input terminal and the second gate electrode of the dual gate FET. The second single gate FET has a gate electrode connected to the first input terminal; a drain electrode connected to the second gate electrode of the dual gate FET; and a source electrode connected to ground or a predetermined voltage potential (negative or positive).

The mixer circuit as a fourth embodiment of this invention has the first and second single gate FETs.

The dual gate FET which is used as an active device in this invention comprises a contact region formed in the substrate and having a high impurity concentration, the contact region located between and isolated from the source and drain regions. The entire upper surface of the contact region is covered by an insulating layer located between the first and second gate electrode. In general, a dual gate FET substantially equals to two single-gate FET connected to each other in series. The contact region having a high impurity concentration functions so as to reduce a parasitic resistance between the single-gate FETs.

The dual gate FET in the mixer circuit mixes the radio frequency signal and the local oscillation signal from the first and second input terminals to output the intermediate frequency signal, and the dual gate FET has a semi-insulating semiconductor substrate, a non-intentionally doped buffer layer formed on the semi-insulating semiconductor substrate, a thin first pulse-doped layer having a high impurity concentration and being formed on the buffer layer, and a cap layer structure formed on the thin first pulse-doped layer.

The cap layer structure comprises a first non-intentionally doped layer, a thin second pulse-doped layer having a high impurity concentration and formed in direct contact with the first non-intentionally doped layer, and a second non-intentionally doped layer formed on the thin second pulse-doped layer.

The source and drain regions respectively extending from an upper surface of the cap layer structure to the buffer layer, and the source and drain electrodes are formed on upper surfaces of the source and drain regions respectively. The first gate electrode is located between said source and drain electrodes and the second gate electrode is located between said first gate electrode and the source electrode. The first and second gate electrodes are spaced apart wherein a distance between the second gate electrode and the source electrode is shorter than a distance between the first gate electrode and the drain electrode; especially, a minimum distance between the second gate electrode and the source region is shorter than a minimum distance between the first gate electrode and the drain region.

The dual gate FET further comprises an insulating layer covering entire upper surface of the contact region. A portion of the first gate electrode partially overlaps a portion of the insulating layer which covers the contact region between the first and second gate electrodes.

As applications, the dual gate FET may be modified as follows.

First, one of the first and second gate electrodes is in contact with an upper surface of the cap layer structure, and another gate electrode is in contact with the first non-intentionally doped layer.

Second, the first and second gate electrodes contact with said upper surface of the cap layer structure and the second non-intentionally doped layer under the second gate electrode is relatively thicker, in a direction perpendicular to the substrate layer, than the second non-intentionally doped layer under the first gate electrode.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Preferred embodiments according to the present invention will be described hereunder with reference to the accompanying drawings.

Figure 1:
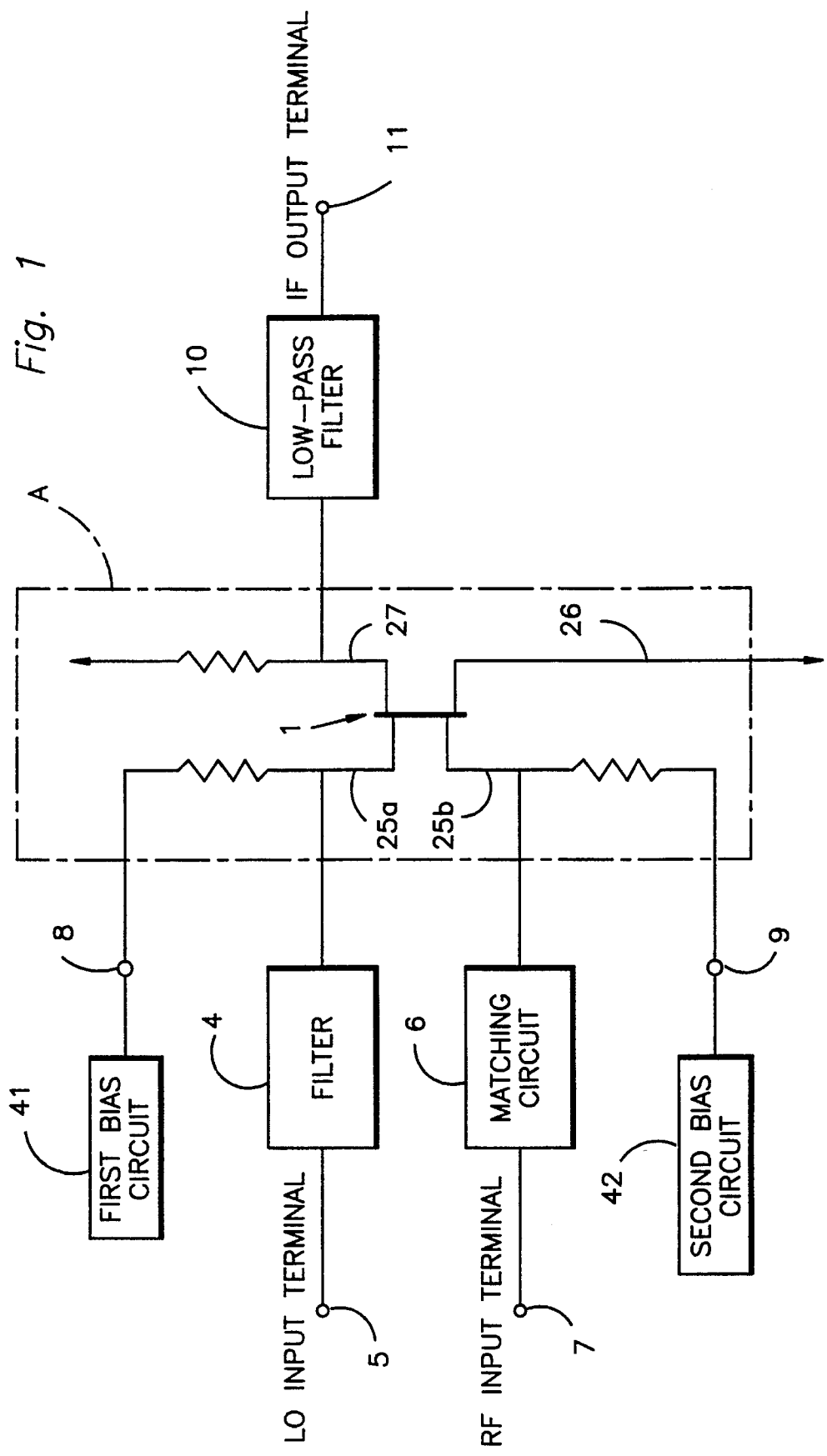
FIG. 1 is a block diagram showing a first embodiment of a mixer circuit according to the present invention.

FIG. 1 is a block diagram showing a first embodiment of a mixer circuit according to the present invention. In this mixer circuit, a dual gate MESFET 1 having a pulse-doped structure is used as an active device A for the mixer circuit.

Figure 2:
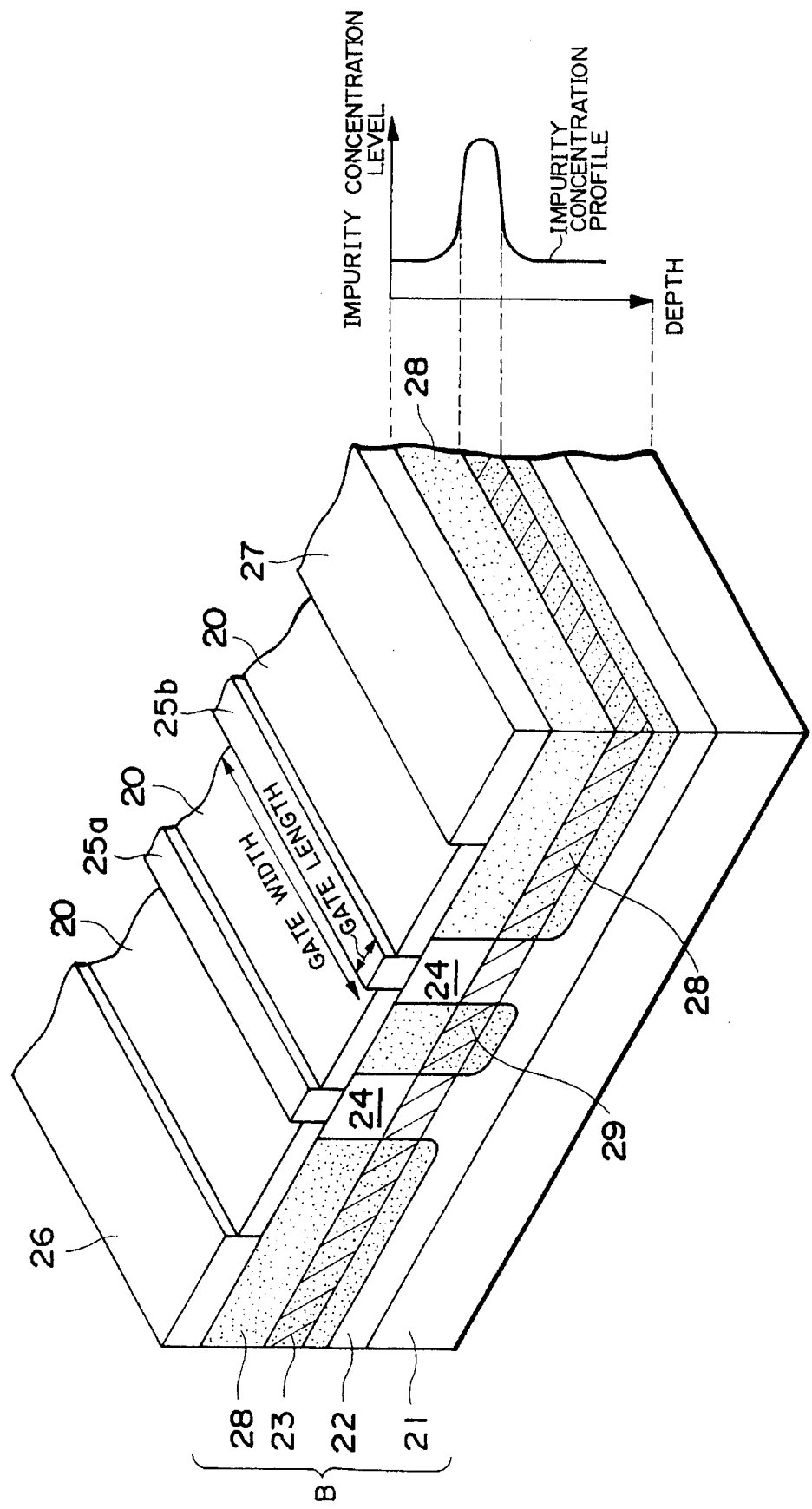
FIG. 2 is a cross-sectional view showing the construction of a first embodiment of a dual gate GaAs-MESFET having a pulse doped structure.

FIG. 2 shows the construction of the GaAs-MESFET 1 having the pulse-doped structure. The pulse doped structure means that a pulse-doped layer 23 is formed in the substrate B of this FET, the pulse-doped layer 23 containing an impurity having a significantly larger impurity concentration level than the other layers. As shown in FIG. 2, the impurity concentration profile which shows the impurity concentration level in the depth direction from upper surface of the substrate B to the bottom of the substrate B is "pulse-shaped" at a predetermined depth associated to the position of the pulse-doped layer 23. The substrate B comprises a semi-insulating GaAs substrate 21, a $P^-$-GaAs buffer layer 22 as a non-intentionally doped layer, a pulse doped GaAs layer 23 doped with Si which serves as an active layer, and an $n^+$-GaAs cap layer 24 as a non-intentionally doped layer, these layers 22, 23, 24 being laminated in this order on a semi-insulating GaAs substrate 21 by an epitaxial growth method.

A source electrode 26 and a drain electrode 27 which are ohmic-contacted with the cap layer 24 are respectively formed on source and drain regions 28 in the cap layer 24, and a pair of first and second gates 25a, 25b which form Shottky-junction contact with the cap layer 24 are formed in a region between the source and drain regions 28. An $n^+$ ion-injection region 28 is formed in each of the areas where the source electrode 26 and the drain electrode 27 are formed and the area between the first gate electrode 25a and the second gate electrode 25b such that the $n^+$ ion implanted regions 28 (contact region) extend from the surfaces of these areas to the upper portion of the buffer layer 22. The contact region 29 is located between and isolated from the source and drain regions 28, and the entire upper surface of the contact region 29 is covered by an insulating layer 20.

In general, a dual gate FET substantially equals to two single-gate FET connected to each other in series. The contact region 29 as an $n^+$ ion implanted region functions so as to reduce a parasitic resistance between the single-gate FETs. The gate length is set to 0.5 μm and the gate width is set to about 300 μm.

The thickness of each layer is set to the following values for example. The thickness of the buffer layer 22 is set to 10000Å, the thickness of the pulse-doped layer 23 is set to 100 Å, the thickness of the cap layer 24 is set to 300 Å, and the impurity density of the pulse doped layer 23 is set to $4.0 \times 10^{18} cm^{-3}$. An organic metal vapor phase epitaxial growth method (OMVPE method) is used as the epitaxial growth method. In particular, a Cr-doped GaAs substrate is used as a semi-insulating semiconductor substrate 21, and both of TMG (trimethyl garium) and $AsH_3$ as source gases and $SiH_6$ as dopant gas are introduced at 60 torr pressure and below 650° C. to perform the vapor phase epitaxial growth. At this time, a source gas introduction V/III ratio is 6 (for buffer layer 22) : 40 (for pulse doped layer 23): 100 (cap layer 24).

The first gate electrode 25a of the FET 1 is connected through a filter 4 to a second input terminal 5 for local oscillation (LO) signals. The filter 4 serves to prevent an IF signal generated in the mixer circuit from leaking to the local oscillation circuit side which is connected to the first input terminal 5. The second gate electrode 25b of the FET 1 is connected to a second input terminal 7 for RF (radio frequency) signals through a matching circuit 6 for performing the matching of input impedance. With this arrangement, the RF signal input through the second input terminal 7 is compounded with the LO signal input through the first input terminal 5, and converted to an intermediate-frequency signal. The drain electrode 27 of the FET 1 is connected to an output terminal 11 through a low-pass filter 10 for passing therethrough only the IF (intermediate frequency) signal which is an output signal. With this arrangement, the IF signal obtained by mixing down the RF signal is output from the output terminal 11.

Terminals 8 and 9 serve as input terminals for supplying a direct-current gate bias voltage to the first and second gate electrodes 25a and 25b of the FET 1, respectively. The input terminal 8 is connected to a first bias circuit 41 (as a first bias means) for supplying the first gate electrode 25a with a gate bias voltage in the neighborhood of the pinch-off voltage of the first gate electrode 25a. The input terminal 9 is connected to a second bias circuit 42 (as a second bias means) for supplying the second gate electrode 25b with such a gate bias voltage that the mutual conductance of the second gate electrode 25b is set to a fixed value even when the gate input voltage of the second gate electrode 25b is varied.

Here, significance of the bias voltage values which are supplied by the first and second bias circuits 41 and 42 will be described.

Like the conventional FET mixer circuit, the frequency conversion in the mixer circuit of this invention is carried out using non-linearity of mutual conductance. Accordingly, the first gate electrode 25a to which the LO signal is input is required to be operated at a gate bias point where the mutual conductance $g_m$ behaves non-linearly with variation of the gate voltage $v_g$. On the other hand, the second gate electrode 25b, which is supplied with the RF signal and for which stable input impedance is required, is necessary to be operated at a gate bias point where the mutual conductance $g_m$ is unvaried with respect to the gate voltage $v_g$.

Figure 3:
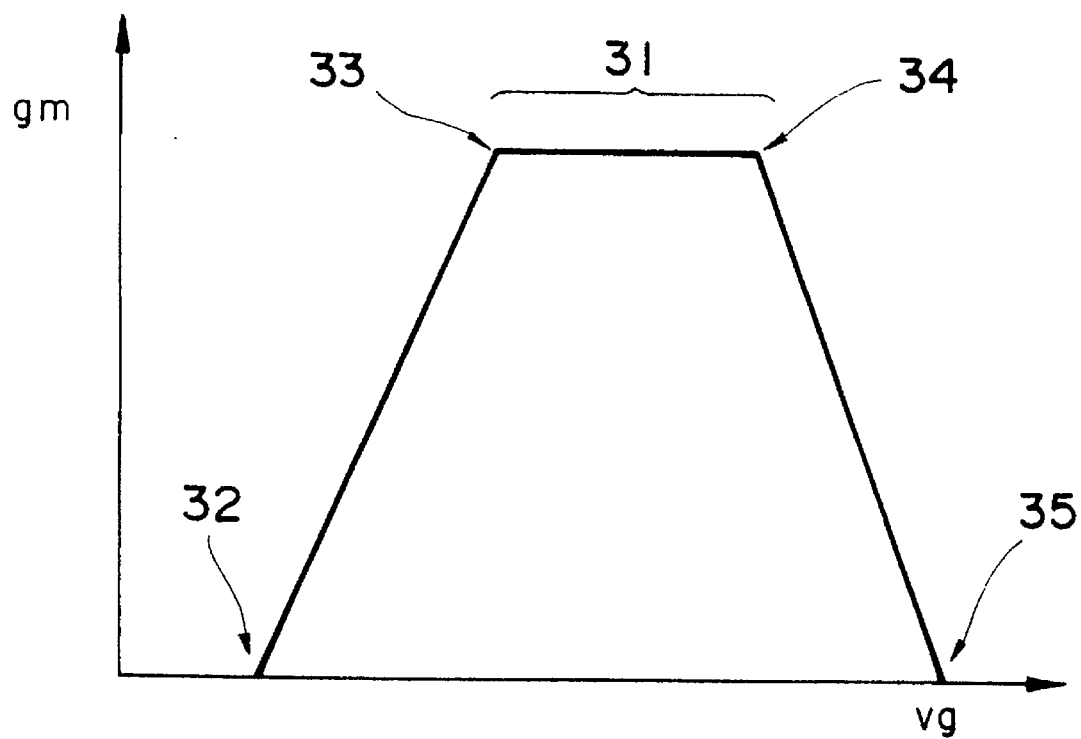
FIG. 3 is a graph showing a gate voltage $V_g$ vs. the mutual conductance $g_m$ characteristic of the pulse doped structure of GaAs-MESFET.

FIG. 3 is a graph showing the characteristic of gate voltage $v_g$ vs. the mutual conductance $g_m$ of each of the first and second gate electrodes. Those portions which are in the vicinity of four points as indicated by reference numerals 32 to 35 in FIG.3 are considered as a gate bias point where the mutual conductance $g_m$ behaves non-linearly with variation of the gate voltage $v_g$. That is, large conversion efficiency is obtained at the portions in the neighborhood of these points. On the other hand, a flat area 31 is selected as a gate bias point where the input impedance is not greatly varied with fluctuation of the gate voltage. The flat area 31 where the mutual conductance $g_m$ is unvaried with variation of the gate voltage $v_g$ is an inherent characteristic to the GaAs-MESFET having pulse-doped structure, and a conventional device does not have such a characteristic. Non-variation of the mutual conductance $g_m$ means non-variation of input capacitance, that is, the gate/source capacitance $C_{gs}$ (capacitance between the gate and the source), and the input impedance of each of the first and second gate electrodes is remarkably dependent on the gate/source capacitance Cgs of each gate electrode. Accordingly, no great variation occurs in the input impedance insofar as the gate voltage $v_g$ is varied in the flat area 31. The impedance is approximately represented by the following equation, and it is also apparent from this equation that the input impedance is greatly dependent on the gate/source capacitance Cgs.

$$Z_{in}=R_g+1/jwC_{gs}+R_{in}+R_s$$

where, $R_g$ represents gate resistance; $R_{in}$, channel resistance; and $R_s$, source resistance.

From the above consideration, the gate bias point for the first gate electrode 25a supplied with the LO signal is set to any one of the portions in the vicinity of the four points as indicated by reference numerals 32 to 35. In order to minimize power consumption, it is preferable to set it at the vicinity of the point 32, that is, the pinch-off point. Further, it is preferable that the flat area 31 where the input impedance is stabilized with variation of the gate voltage is set to the gate bias point for the second gate electrode 25b which is input with the RF signal and for which stable input impedance is required. Like the first gate electrode 25a, low power consumption is also required for the second gate electrode 25b, and in consideration of this point, the bias point is preferably set to the portion in the vicinity of the point having the lowest gate voltage in the flat area 31, that is, the point 33 in FIG. 3.

Next, in order to realize a high-output, high-efficiency GaAs-MESFET, it is important to decrease the resistance between the source and gate electrodes, i.e., the source resistance ($R_s$), and increase the transconductance ($g_m$)

while increasing the drain breakdown voltage between the gate and drain electrodes.

In a dual gate MESFET, in order to increase the drain breakdown voltage, the drain-side gate electrode, i.e., the first gate electrode, is formed apart from a drain region, which is an ion implanted region having a high-impurity-concentration, on the drain electrode side. In this case, a gate elongation effect is caused to increase the effective gate length in a range where the gate bias is low, i.e., a range where the gate bias is a negative value close to 0 V if the FET is an n-channel FET. As a result, the transconductance $g_m$ of the FET is decreased in the range.

Applications of the dual gate FET in the mixer circuit according to the present invention will be explained, for increasing the drain breakdown voltage of a dual-gate FET without decreasing the transconductance $g_m$.

In order to achieve the above object, a field effect transistor in the mixer circuit according to the present invention comprises a substrate having a non-intentionally doped buffer layer, a thin first pulse-doped layer with a high impurity concentration, and a cap layer sequentially formed on an underlying semiconductor substrate by epitaxial growth. The cap layer has a thin second pulse-doped layer with a high impurity concentration sandwiched between non-intentionally doped layers. The second pulse-doped layer has a thickness and an impurity concentration set such that the second pulse-doped layer is depleted by a surface depletion layer caused by the interface state of a surface of the cap layer, and the surface depletion layer does not extend to the first pulse-doped layer. A source electrode, a drain electrode, and first and second gate electrodes are formed on an upper surface of the substrate. Ion implanted regions having a high impurity-concentration are formed in the substrate, as source and drain regions and a contact region which is located between and isolated from the source and drain regions. The contact region extends from the upper surface of the substrate, between the first and second gate electrodes to the first pulse-doped layer. The first gate electrode formed on the drain electrode side is separated from the drain region.

when the first gate electrode is separated from the drain region, a surface depletion layer due to the interface state of the substrate surface is formed in the separated portion as well as in a portion below the first gate electrode. However, extension of this surface depletion layer in the direction of depth is prevented by the second pulse-doped layer in the cap layer. Consequently, the first pulse-doped layer as a channel layer is free from the influence of the surface depletion layer, and only the depletion layer immediately below the first gate electrode has an effective influence on the channel layer. That is, no increase in effective gate length occurs. Therefore, no reduction in the transconductance $g_m$ on the low-gate-bias range occurs, and the transconductance $g_m$ becomes constant with respect to a wide range of changes in gate bias.

Figure 4:
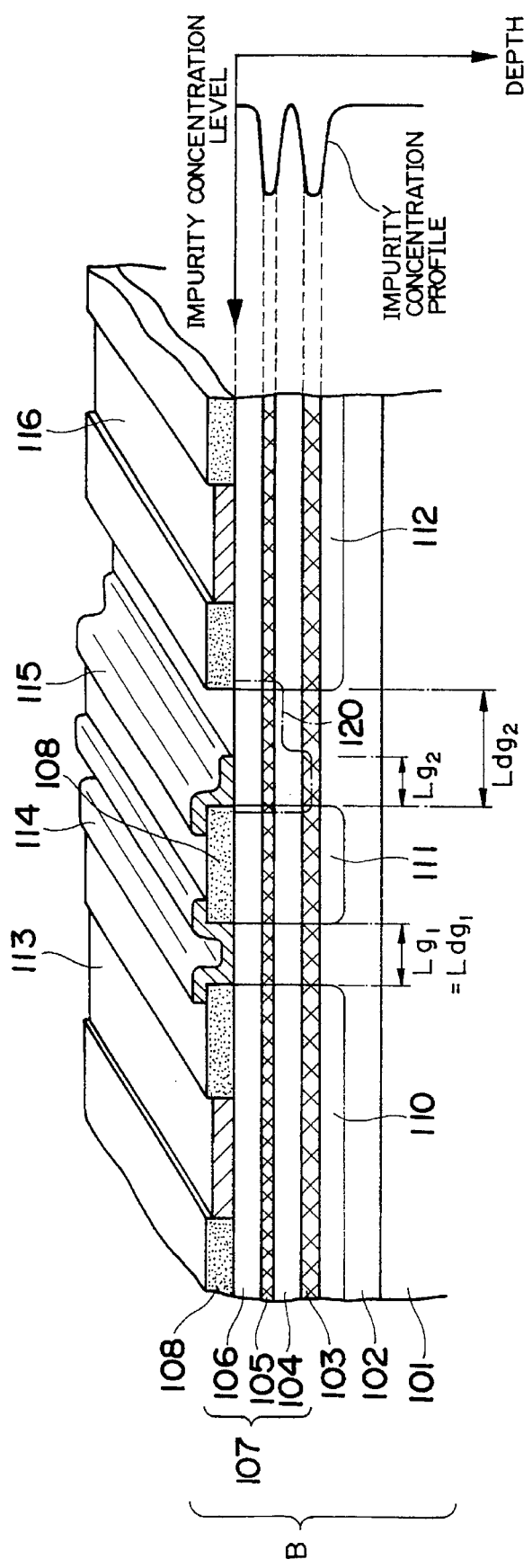
FIG. 4 is a perspective view showing an exposed cross-sectional surface according to a second embodiment of the dual gate GaAs-MESFET.
Figure 5:
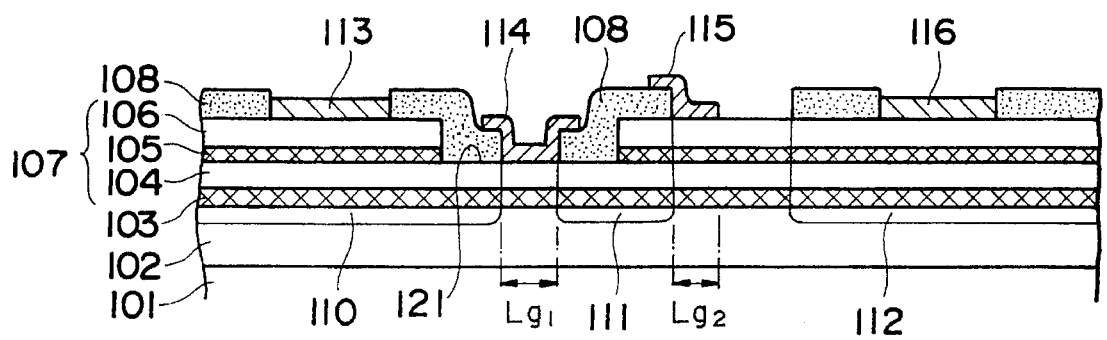
FIG. 5 is a sectional view showing the third embodiment of the dual gate GaAs-MESFET.
Figure 6:
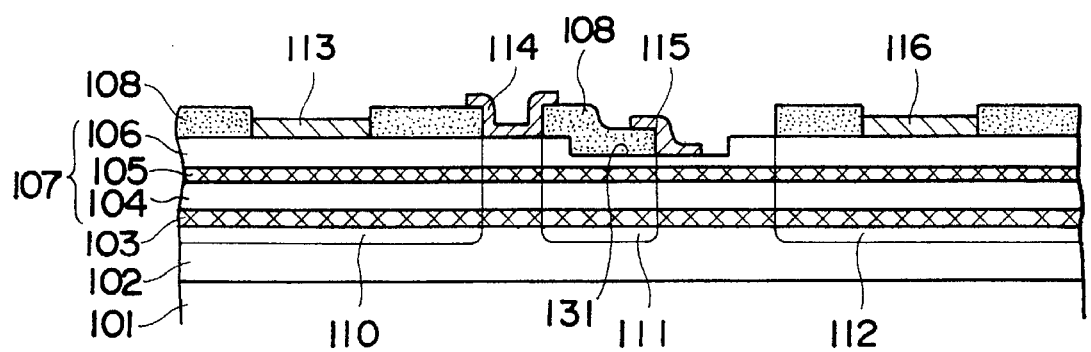
FIG. 6 is a sectional view showing the fourth embodiment of the dual gate GaAs-MESFET.

A second embodiment of a dual-gate MESFET in the mixer circuit according to the present invention will be described with reference to FIG. 4. As shown in FIG. 4, this dual gate FET comprises a semi-insulating semiconductor substrate 101, a non-intentionally doped buffer layer 102 formed on the semi-insulating semiconductor substrate 101, a thin first pulse-doped layer 103 having a high impurity concentration and being formed on the buffer layer 102, and a cap layer structure 107 formed on the thin first pulse-doped layer 103. The cap layer structure 107 comprises a first non-intentionally doped layer 104, a thin second pulse-doped layer 105 having a high impurity concentration and formed in direct contact with the first non-intentionally doped layer 104, and a second non-intentionally doped layer 105 formed on the thin second pulse-doped layer 105.

The source and drain regions 110, 112 respectively extending from an upper surface of the cap layer structure 107 to the buffer layer 102, and the source and drain electrodes 113, 116 are formed on upper surfaces of the source and drain regions 110, 112 respectively. The first gate electrode 115 is located between said source and drain electrodes 113, 116 and the second gate electrode 114 is located between said first gate electrode 115 and the source electrode 113. The first and second gate electrodes 115, 114 are spaced apart wherein a distance between the second gate electrode 114 and the source electrode 113 is shorter than a distance between the first gate electrode 115 and the drain electrode 116; especially, a minimum distance between the second gate electrode 114 and the source region 110 is shorter than a minimum distance between the first gate electrode 115 and the drain region 112.

The dual gate FET further comprises an insulating layer 108 covering entire upper surface of the contact region 111. A portion of the first gate electrode 115 partially overlaps a portion of the insulating layer 108 which covers the contact region 111 between the first and second gate electrodes 115, 114.

A non-doped GaAs buffer layer 102 is formed on a semi-insulating GaAs semiconductor substrate 101. This buffer layer 102 is formed by a crystal growth technique such as the MBE method (molecular beam epitaxy method) or the OMVPE method (organic metal vapor phase epitaxy method). In order to improve the carrier trapping property of a channel layer 103 (to be described later), the conductivity type of the buffer layer 102 is set to be p conductivity type by controlling the supply ratio of a Group V material to a Group III material. The carrier density of the GaAs buffer layer 102 is set to be, e.g., $2.5 \times 10^{15}$ cm$^{-3}$.

An Si-doped n-type first GaAs pulse-doped layer 103 is formed on the buffer layer 102. The pulse-doped layer 103 has a high carrier density, $4 \times 10^{18}$ cm$^{-3}$, and a small thickness, 200 angstroms. A cap layer structure 107 is constituted by a first non-intentionally doped GaAs layer 104, a second GaAs pulse-doped layer 105, and a second non-intentionally doped GaAs layer 106 is formed on the first pulse-doped layer 103 by a crystal growth technique such as the MBE method or the OMVPE method. The non-intentionally doped GaAs layer 104 is of n conductivity type and has a carrier density of $1 \times 10^{15}$ cm$^{-3}$ or less, and a thickness of 150 angstroms. The second GaAs pulse-doped layer 105 is an Si-doped layer of n conductivity type, which has the same high carrier density as that of the first pulse-doped layer 103, i.e., $4 \times 10^{18}$ cm$^{-3}$, and a thickness of 50 angstroms. The non-doped GaAs layer 106 is of n conductivity type and has a carrier density of $1 \times 10^{15}$ cm$^{-3}$ or less and a thickness of 200 angstroms.

The thickness and impurity concentration of the second GaAs pulse-doped layer 105 are set such that the second GaAs pulse-doped layer 105 is depleted by a surface depletion layer caused by the interface state of the substrate surface, i.e., the upper surface of the non-doped GaAs layer 106, and the surface depletion layer does not extend to the first pulse-doped layer 103.

The first and second gate electrodes 115, 114 and the source and drain regions 110, 112 as ion implanted regions having high impurity-concentrations are formed on the epitaxial wafer having such a laminated structure by a self alignment technique or the like. In addition, a source electrode 113 and a drain electrode 116 are formed on the wafer.

The source and drain regions 110, 112 and the contact region 111 are formed by two steps below. The first step is forming first and second dummy gates (not shown), consisting of a photoresist, on an upper surface of the substrate B of which a predetermined region is formed the first and second electrodes on. The second step is implanting Si ions using the first and second dummy gates as masks. Thereafter, an inorganic insulating film such as an $SiO_2$ film is deposited on the entire surface of the resultant structure. The $SiO_2$ film is lifted off by using the first and second dummy gates to form an $SiO_2$ film 108 having openings in the predetermined regions. Portions, of the $SiO_2$ film 108, which correspond to upper surfaces of respective source and drain regions 110, 112 are removed, and deposition of an Ohmic metal and a lift-off process are performed, thus forming a source electrode 113 and a drain electrode 116. Deposition of a Schottky metal and a lift-off process are performed to form first and second gate electrodes 114 and 115.

A gate length $L_{dg2}$ of the first dummy gate on the drain side is set to be larger than a gate length $L_{dg1}$ of the second dummy gate on the source side. The second gate electrode 114 overlaps the source region 110 and the contact region 111 through the $SiO_2$ film 108, whereas the first gate electrode 115 overlaps only the contact region 111 through the $SiO_2$ film 108. With this structure, the second gate electrode 114 has a so-called self-aligned structure with respect to the source regions 110 and the contact region 111 so that a gate length $L_{g1}$ is shortened to the limit of a lithographic technique used in the formation of a dummy gate. In addition, the first gate electrode 115 is sufficiently separated from the drain region 112 on the drain side.

According to the dual-gate MESFET having the above-described arrangement, since the first gate electrode 115 is sufficiently separated from the drain region 112 on the drain side, the drain breakdown voltage is high. Furthermore, since the cap layer structure 107 in this separated portion includes the second GaAs pulse-doped layer 105, the gate elongation effect due to a surface depletion layer is suppressed. Therefore, the effective gate length in the first gate electrode 115 is almost equal to a gate length $L_{g2}$, and hence is sufficiently reduced to a length almost equal to the gate length of the second gate electrode 114 having the self-aligned structure. A depletion layer 120 in FIG. 4 is in a state wherein a negative gate voltage is applied to the first gate electrode 115. As is apparent from FIG. 4, the depletion layer 120 constricts the channel (first pulse-doped layer 103) only at a position immediately below the first gate electrode 115. A portion of the depletion layer 120 between the first gate electrode 115 and the drain region 112 is caused by the interface state of the surface of the cap layer structure 107 and is prevented by the second pulse-doped layer 105 from extending downward. When a high-frequency signal is input to only the second gate electrode 114, and the first gate electrode 115 is used for gain control, the gate length $L_{g2}$ of the first gate electrode 115 need not be reduced so much as in the above case. Thus, the manufacturing yield of the MESFET of the embodiment applied in such a manner is very high. When the first gate electrode 115 is separated from the source region 112 on the drain side, a drain conductance $g_d$ becomes small. Since the gain of an FET increases with an increase in $g_m/g_d$, an FET having a high gain is manufactured.

FIGS. 5 to 10 are sectional views showing the third to eighth embodiments of the dual-gate MESFET in mixer circuit according to the present invention. The same reference numerals in the third to eighth embodiments denote the same parts as in the second embodiment shown in FIG. 4, and a repetitive description will be avoided. The differences between the second embodiment (FIG. 4) and the remaining embodiments will be mainly described below.

In the third embodiment (FIG. 5) and the fourth embodiment (FIG. 6), a cap layer structure 107 has a trench at a portion thereof sandwiched between the source and drain regions 110, 112. When a trench portion 121 or 131 is formed in the cap layer structure 107 to shorten the distance between one of the first and second gate electrode 115, 114 and a channel layer 103 (first pulse-doped GaAs layer), the threshold voltage is set to be low, i.e., is reduced toward 0 V. With this structure, the first and second gate electrodes 115, 114 have different threshold voltages and different pinch-off voltages in the each embodiment. The depth of a trench portion is set to be a predetermined value by controlling the etching time.

Figure 7:
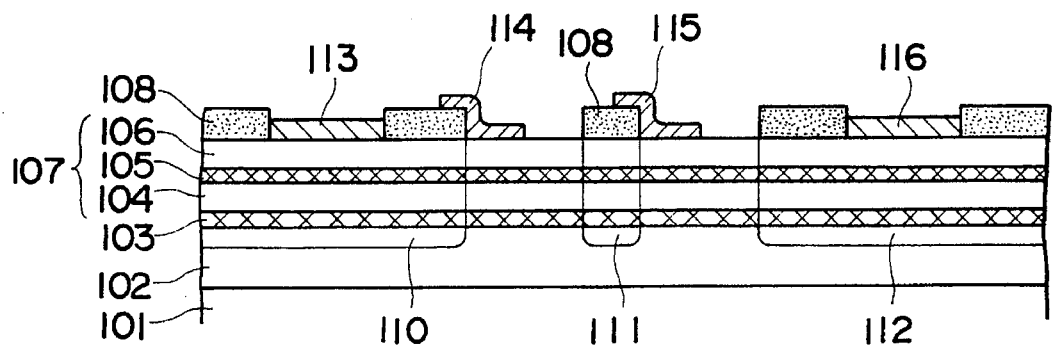
FIG. 7 is a sectional view showing the fifth embodiment of the dual gate GaAs-MESFET.
Figure 8:
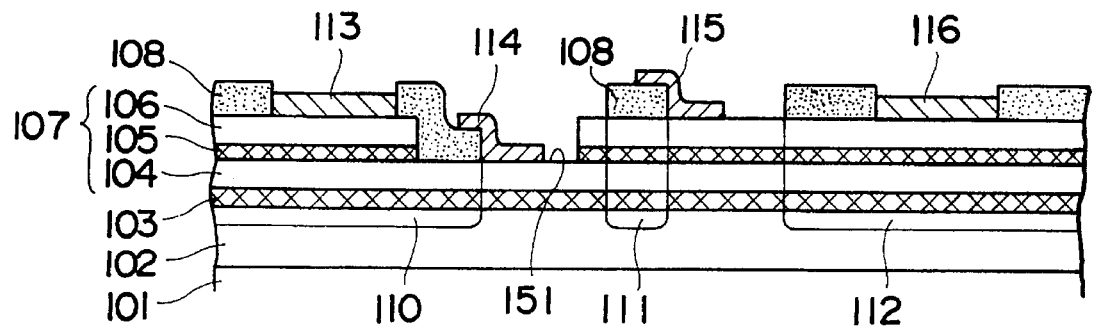
FIG. 8 is a sectional view showing the sixth embodiment of the dual gate GaAs-MESFET.
Figure 9:
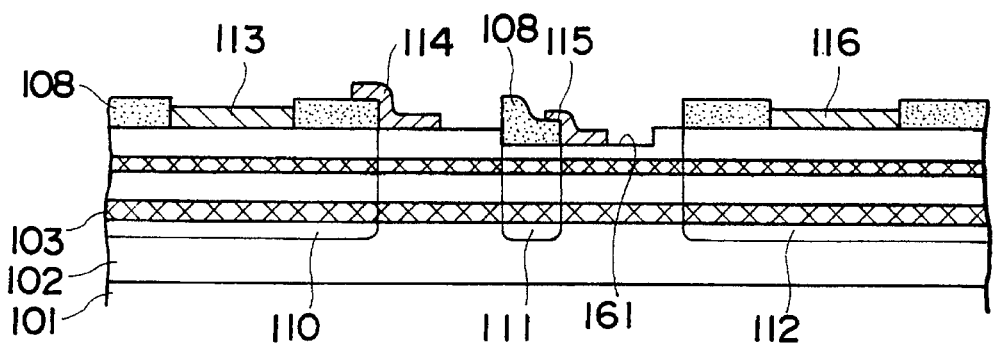
FIG. 9 is a sectional view showing the seventh embodiment of the dual gate GaAs-MESFET.

In the fifth embodiment shown in FIG. 7, the sixth embodiment shown in FIG. 8, and the seventh embodiment shown in FIG. 9, only one side of a second gate electrode 114 overlaps a contact region 110 through the $SiO_2$ film 108, similar to a first gate electrode 115. With this structure, a higher drain breakdown voltage is obtained. Similar to the third embodiment shown in FIG. 5 and the fourth embodiment shown in FIG. 6, the sixth embodiment shown in FIG. 8 and the seventh embodiment shown in FIG. 9 are designed such that trench portions 151 and 161 are formed to allow the first and second gate electrodes 115, 114 to have different threshold voltages.

Figure 10:
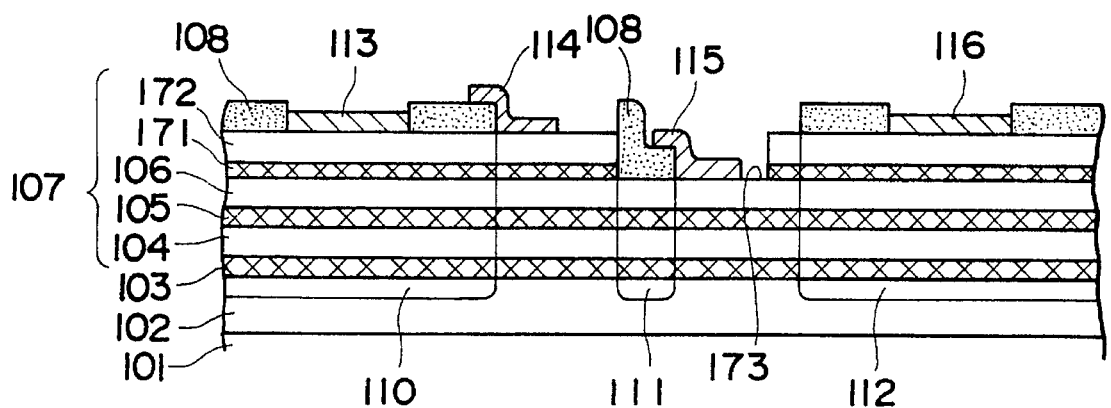
FIG. 10 is a sectional view showing the eighth embodiment of the dual gate GaAs-MESFET.

Lastly, in the eighth embodiment shown in FIG. 10, a third pulse-doped layer 171 and a third non-intentionally doped GaAs layer 172 are added to a cap layer structure 107 in the seventh embodiment to form a five-layer structure. In this structure, since the two pulse-doped layers for preventing extension of a surface depletion layer in the direction of depth are formed, the depth of a trench portion 173 for threshold voltage adjustment can be further increased.

As has been described above, according to the dual gate FET shown in FIGS. 4 to 10, since the first gate electrode is sufficiently separated from the drain region, a high drain breakdown voltage is obtained. In addition, since the cap layer structure includes the pulse-doped layer for preventing extension of a surface depletion layer in the direction of depth, the gate elongation effect in the second gate electrode is suppressed to improve the linearity of the transconductance $g_m$, thereby realizing excellent high-frequency characteristics.

Figure 12:
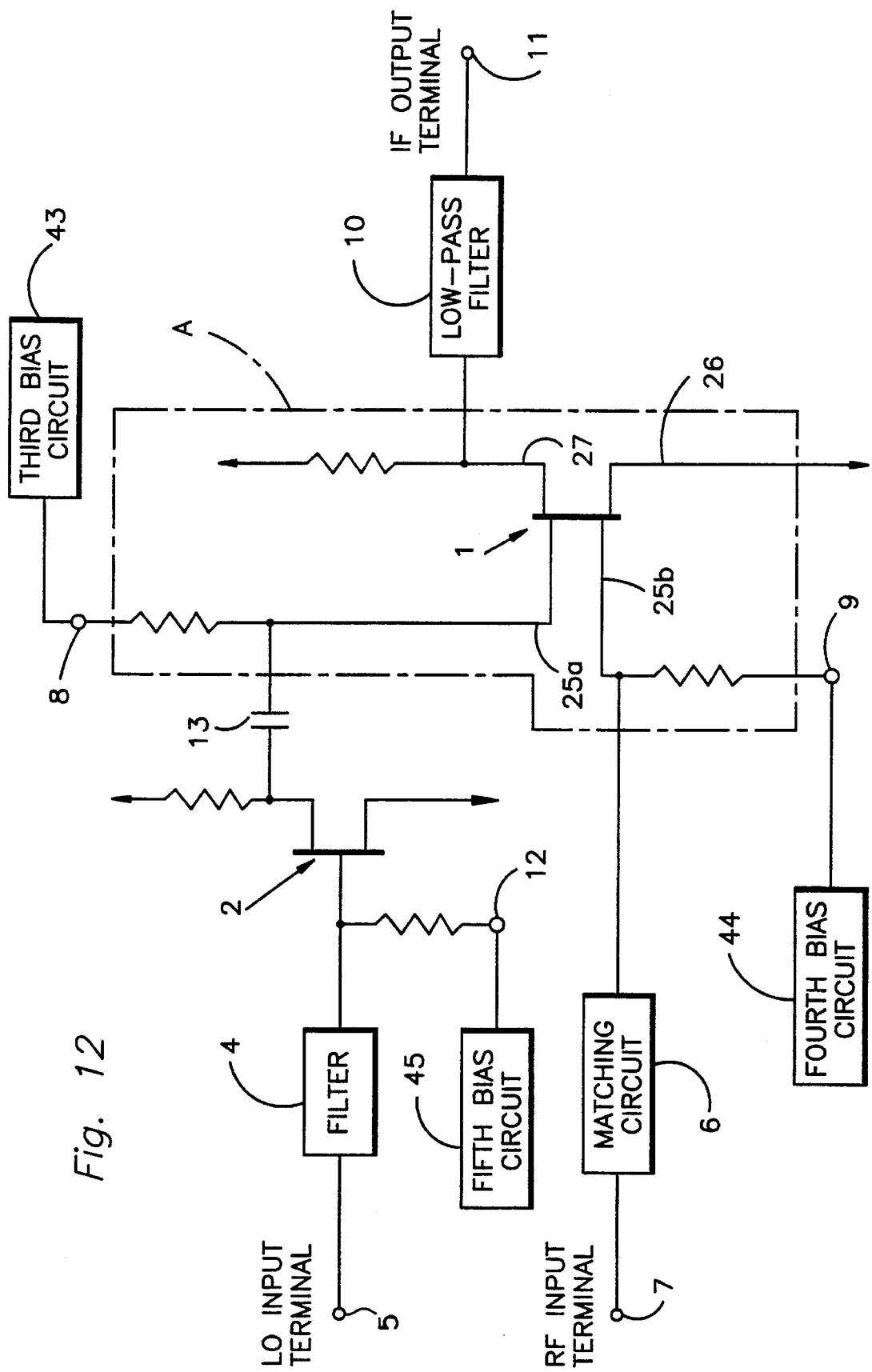
FIG. 12 is a block diagram showing a second embodiment of a mixer circuit according to the present invention.

Next, FIG. 12 shows a second embodiment of the mixer circuit of this invention.

The mixer circuit is so designed that a first single gate GaAs-MESFET 2 having pulse-doped structure is provided as a second FET between the filter 4 and the first gate electrode 25a of the dual gate FET 1 as shown in FIG. 1. The gate electrode of the FET 2 is connected to the first input terminal 5 for an LO signal through the filter 4, a drain electrode of the FET 2 is connected to the first gate 25a of the FET 1 through a coupling capacitor 13, a source electrode of the FET 2 is connected to a predetermined voltage potential, such as ground. With this arrangement, alternating current components of a signal output from the drain electrode of the FET 2 are input to the first gate 25a of the FET 1. The gate electrode of the FET 2 is connected to an input terminal 12 for supplying a proper DC gate bias voltage. The input terminal 12 is connected to a fifth bias circuit 45 (as a third bias means) for supplying such a gate bias voltage that the mutual conductance is unvaried even when the gate input voltage is varied for the gate electrode of the FET 2. The input terminals 8 and 9 of the FET 1 of the mixer circuit are connected to a third bias circuit 43 (as a first bias means) and a fourth bias circuit 44 (as a second bias means), respectively. The third bias circuit 43 supplies the first gate electrode 25a of the FET 1 with a gate bias voltage which is in the vicinity of the pinch-off voltage of the first gate 25a of the FET 1, and the fourth bias circuit 44 supplies the second gate electrode 25b of the FET 1 with such a bias voltage that the mutual conductance of the second gate electrode 25b is unvaried even when the gate input voltage of the second gate electrode 25b is varied.

Figure 11:
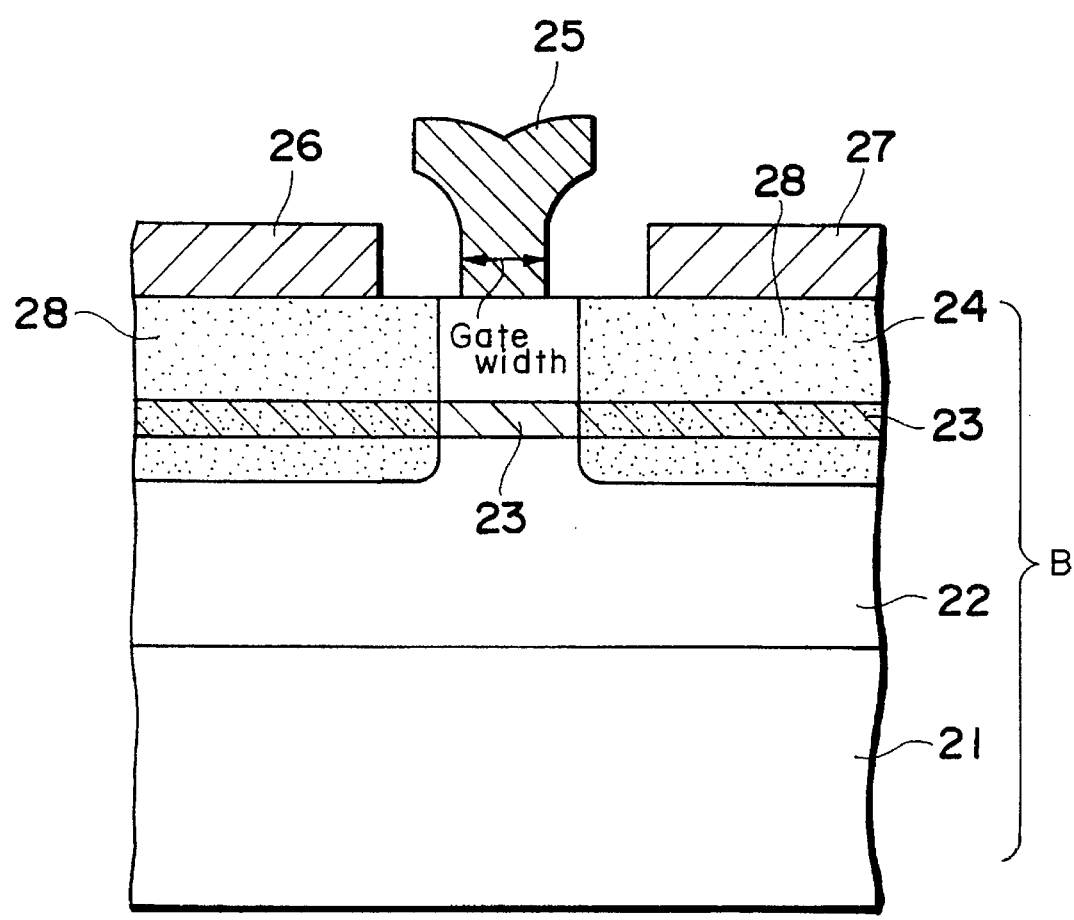
FIG. 11 is a sectional view showing the construction of the single gate FET in the mixer circuit.

In the mixer circuit thus constructed, the FET 2 has a gate 25 as shown in FIG. 11, and the gate width thereof is designed in about 50 to 100 μm, which is shorter than that of the FET 1. As described above, the LO signal is input to the FET 2 having short gate width, and thus the power consumption can be more reduced in comparison with the mixer circuit as shown in FIG.1. By setting the gate bias point of the FET 2 to the flat area 31 (see FIG. 3) where the input impedance is stabilized with variation of the gate voltage, the degree of freedom in bias is increased, and the bias providing the maximum conversion efficiency can be selected.

Figure 13:
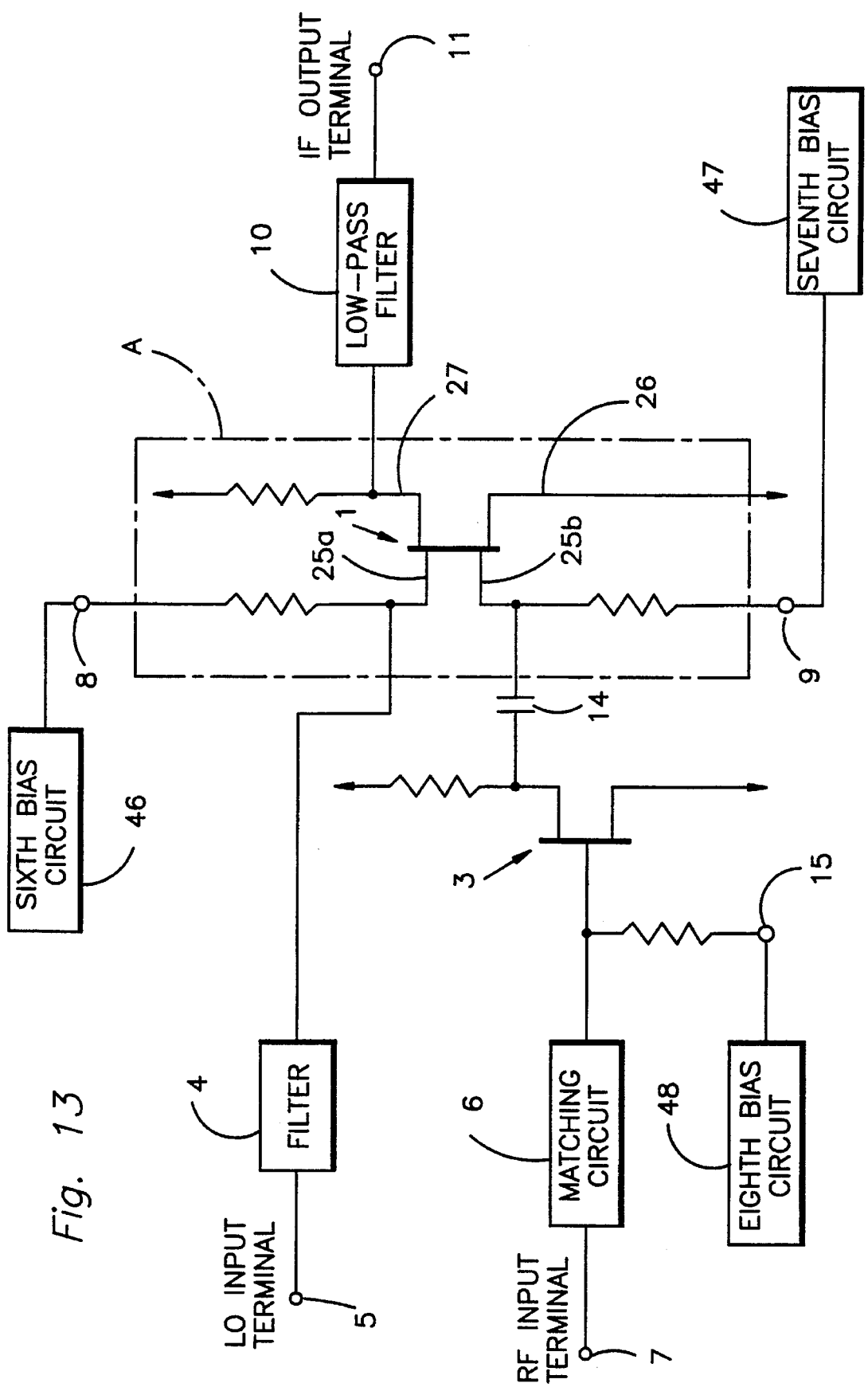
FIG. 13 is a block diagram showing a third embodiment of a mixer circuit according to the present invention.

FIG. 13 shows a third embodiment of the mixer circuit of this invention. The mixer circuit is so designed that a single gate GaAs-MESFET 3 having a pulse doped structure is provided between the matching circuit 6 and the second gate electrode 25b of the FET 1 as shown in FIG. 1. The gate electrode of the FET 3 is connected to the second input terminal 7 for the RF signal through the matching circuit 6, a drain electrode of the FET 3 is connected to the second gate electrode 25b of the FET 1 through the coupling capacitor 14 and a source electrode of the FET 3 is connected to a predetermined voltage potential. With this arrangement, alternating current components of a signal output from the drain electrode of the FET 3 are input to the second gate electrode 25b of the FET 1. The gate electrode of the FET 3 is connected to the input terminal 15 for supplying a proper DC gate bias voltage. The input terminal 15 is connected to an eighth bias circuit 48 (as a third bias means) for supplying a predetermined gate bias voltage to the gate electrode of the FET 3. The input terminals 8 and 9 of the FET 1 of the mixer circuit are connected to a sixth bias circuit 46 (as a first bias means) and a seventh bias circuit 47 (as a second bias means) respectively, which supply the first and second gate electrodes 25a and 25b of the FET 1 with gate bias voltages in the vicinity of the their pinch-off voltages respectively.

In the mixer circuit thus constructed, the FET 3 has a gate electrode 25 as shown in FIG. 11, and the gate width thereof is designed in about 50 to 100 μm, which is shorter than that of the FET 1. As described above, the RF signal is input to the FET 3 having short gate width, and thus the power consumption can be more reduced in comparison with the mixer circuit as shown in FIG. 1. The gate bias point of the FET 3 is preferably set to the flat area 31 (see FIG. 3) where the input impedance is stabilized with variation of the gate voltage by the eighth bias circuit 48. By setting the gate bias point of the FET 3 to the flat area 31 as described above, the degree of freedom in bias is increased, and the bias providing the maximum conversion efficiency can be selected.

Figure 14:
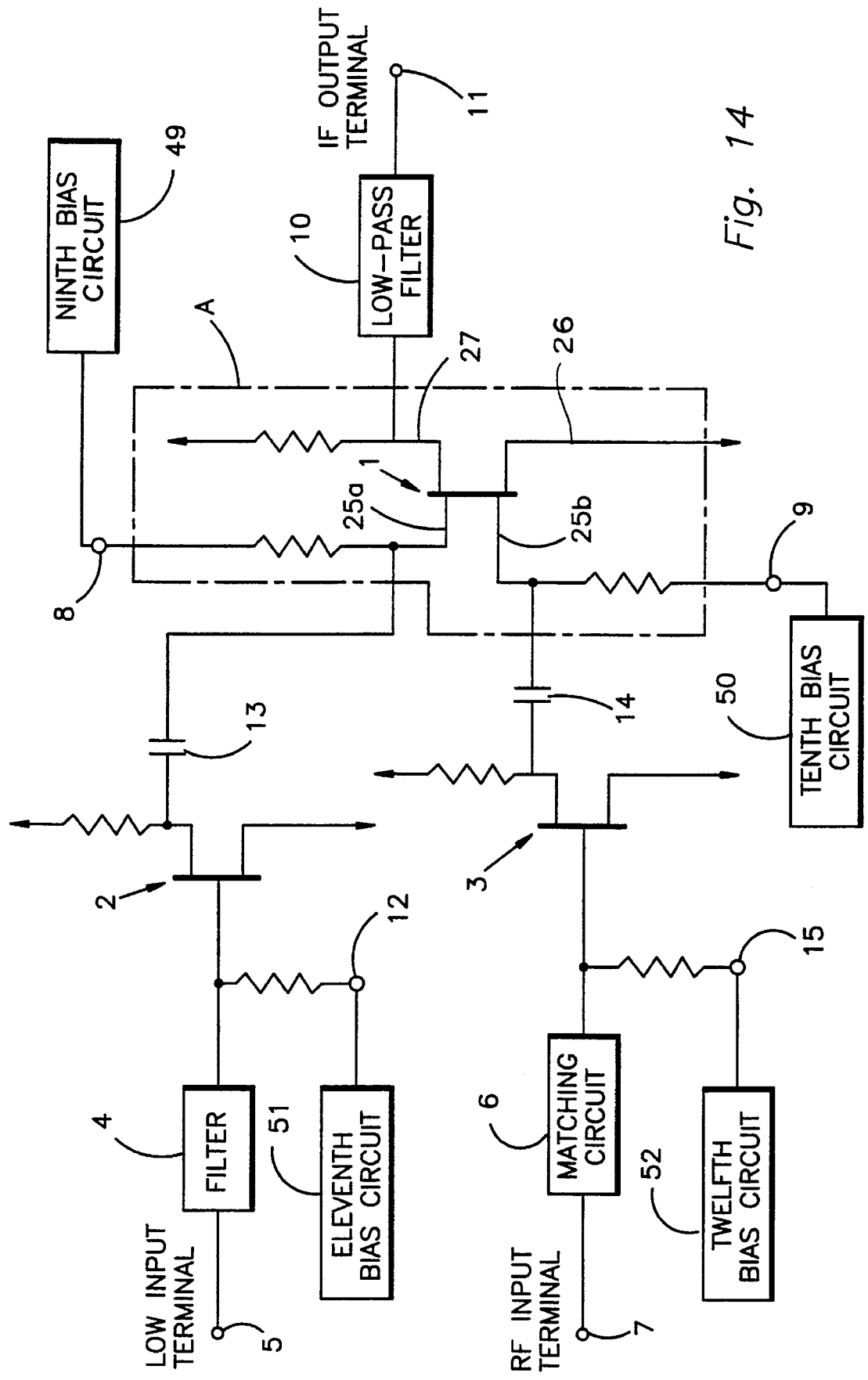
FIG. 14 is a block diagram showing a fourth embodiment of a mixer circuit according to the present invention.

FIG. 14 shows a fourth embodiment of the mixer circuit of this invention. This mixer circuit has the FET 2 (as a first single gate FET) and the FET 3 (as a second single gate FET) in addition to the mixer circuit as shown in FIG. 1. In this case, the input terminals 8 and 9 which are connected to the gate electrodes 25a and 25b of the FET 1 respectively are also connected to a ninth bias circuit 49 (as a first bias means) and a tenth bias circuit 50 (as a second bias means) respectively, and supply the respective gate electrodes 25a and 25b with gate bias voltages in the vicinity of the pinch-off voltages thereof, respectively. The input terminals 12 and 15 which are connected to the gate electrodes of the FET 2 and the FET 3 are connected to an eleventh bias circuit 51 (as a third bias means) and a twelfth bias circuit 52 (as a fourth bias means) respectively, and supply the corresponding gate electrodes with such gate bias voltages that the mutual conductance of each of the gate electrodes is unvaried even when the gate input voltage thereof is varied. (see FIG. 3).

With this circuit construction, the power consumption will be more reduced in comparison with the mixer circuit as shown in FIG. 1. In addition, the degree of freedom in bias is increased, and the bias providing the maximum conversion efficiency can be selected.

As described above, in the mixer circuit as exemplified in the above embodiments, as the active device is used the dual gate MESFET with pulse doped structure which has the first gate electrode and the second gate electrode. In the case where the gate bias point of the first gate electrode is set in the neighborhood of the pinch-off of the mutual conductance and the gate bias point of the second gate electrode is set in the area where the mutual conductance is unvaried with the increase of the gate voltage, there is obtained the mixer circuit in which the isolation characteristic of the RF signal and the LO signal is excellent and the stable operational characteristic having little variation of the input impedance is obtained.

Further, in the case where the pulse doped structure MESFETs 2 and 3 having shorter gate width than the FET 1 are provided between the LO signal input terminals 5 and the first gate electrode 25a and/or between the RF signal input terminal 7 and the second gate electrode 25b, the input current to the FET 1 can be suppressed, so that the power consumption can be reduced. In addition, the gate bias point of the gate of the FET 2,3 is set in the area where the mutual conductance is unvaried with the increase of the gate voltage, so that the degree of freedom of the bias is increased and the bias providing the maximum conversion efficiency can be selected.

It should be noted that this application discloses various embodiments of the invention which include one or more FETs. To simplify the discussion of the invention, the drains of these FETs are not shown as being connected to any particular current source. Also, the sources of these FETs are shown as being connected to the same voltage potential, i.e. ground. However, as would be well understood by one of ordinary skill in the art, these simplifications are made for illustrative purposes only. In actuality, the sources of the FETs could be connected to a variety of different voltage potentials provided by a variety of different circuit elements (e.g., other circuits, ground, a continuous voltage supply, etc.), depending upon the specific use of the invention in a particular circuit. The drains of these FETs could likewise be connected to a variety of current sources.

From the invention thus described, it will be obvious that the invention is varied in many ways. Such variations are not to be regarded as a departure from the spirit and scope of the invention, and all such modifications as would be obvious to one skilled in the art are intended to be included within the scope of the following claims.

What is claimed is:

1. A mixer circuit for mixing a local oscillation signal and a radio frequency signal to supply an intermediate frequency signal, said mixer circuit comprising:

a first input terminal to be supplied with the local oscillation signal;

a second input terminal to be supplied with the radio frequency signal;

an output terminal for supplying the intermediate frequency signal; and a dual gate FET for mixing the local oscillation signal from said first input terminal and the radio frequency signal from said second input terminal to generate the intermediate frequency signal, said dual gate FET having:

a semi-insulating semiconductor substrate;

a buffer layer formed on said substrate;

a thin first pulse-doped layer having a high impurity concentration and being formed on said buffer layer;

a cap layer structure formed on said thin first pulse-doped layer, said cap layer structure including a first undoped layer, a thin second pulse-doped layer having a high impurity concentration and formed in direct contact with said first undoped layers and a second undoped layer formed on said thin second pulse-doped layer;

source and drain regions having high impurity concentrations, each of said source and drain regions extending from an upper surface of said cap layer structure to said buffer layer;

a contact region having a high impurity concentration and extending from said upper surface of said cap layer structure to said buffer layer, said contact region located between and isolated from said source and drain regions;

a drain electrode formed on an upper surface of said drain region and connected to said output terminal;

a source electrode formed on an upper surface of said source region;

a first gate electrode located between said source and drain regions, said first gate electrode being connected to said first input terminal;

a second gate electrode located between said first gate electrode and said source electrode, said second gate electrode being connected to said second input terminal; and an insulating layer located between said first and second gate electrodes and covering an upper surface of said contact region.

2. A mixer circuit according to claim 1, further including a single gate FET with a pulse-doped structure, said single gate FET being disposed between said first input terminal and said first gate electrode, said single gate FET having:

a gate electrode connected to said first input terminal; and a drain electrode connected to said first gate electrode of said dual gate FET.

3. A mixer circuit according to claim 2, wherein said gate electrode of said single gate FET has a narrower gate width than said first gate electrode of said dual gate FET.

4. A mixer circuit according to claim 1, further comprising a single gate FET with a pulse-doped structure, said single gate FET being disposed between said second input terminal and said second gate electrode of said dual gate FET, said single gate FET having:

a gate electrode connected to said second input terminal; and a drain electrode connected to said second gate electrode of said dual gate FET.

5. A mixer circuit according to claim 4, wherein said gate electrode of said single gate FET has a narrower gate width than said second gate electrode of said dual gate FET.

6. A mixer circuit according to claim 1, further comprising:

a first single gate FET with a pulse-doped structure, said first single gate FET being disposed between said first input terminal and said first gate electrode, said first single gate FET having a gate electrode connected to said first input terminal and a drain electrode connected to said first gate electrode of said dual gate FET; and a second single gate FET with a pulse-doped structure, said second single gate FET being disposed between said second input terminal and said second gate electrode of said dual gate FET, said second single gate FET having a gate electrode connected to said second input terminal, and a drain electrode connected to said second gate electrode of said dual gate FET.

7. A mixer circuit according to claim 6, wherein said gate electrode of said first single gate FET has a narrower gate width than said first gate electrode of said dual gate FET, and said gate electrode of said second single gate FET has a narrower gate width than said second gate electrode of said dual gate FET.

8. A mixer circuit according to claim 1, wherein said source electrode is connected to ground.

9. A mixer circuit according to claim 2, wherein said source electrode is connected to ground.

10. A mixer circuit according to claim 4, wherein said source electrode is connected to ground.

11. A mixer circuit according to claim 6, wherein said source electrode is connected to ground.

12. A mixer circuit according to claim 1, wherein said thin first pulse-doped layer is made of GaAs with Si as a dopant.

13. A mixer circuit according to claim 1, wherein said thin second pulse-doped layer is made of GaAs with Si as a dopant.

14. A mixer circuit according to claim 1, wherein said thin first and second pulse-doped layers have the same conductivity type.

15. A mixer circuit according to claim 14, wherein said conductivity type is n-type.

16. A mixer circuit according to claim 1, wherein said thin first pulse-doped layer is made of n-type GaAs.

17. A mixer circuit according to claim 1, wherein said thin second pulse-doped layer is made of n-type GaAs.

18. A mixer circuit according to claim 1, wherein said thin first and second pulse-doped layers are made of n-type GaAs.

19. A mixer circuit according to claim 1, wherein said semiconductor substrate, said buffer layer, said thin first pulse-doped layer, and said cap layer structure are made of GaAs.

20. A mixer circuit according to claim 1, wherein said thin second pulse-doped layer is thinner than said thin first pulse doped layer.

21. A mixer circuit according to claim 1, wherein said insulating layer is made of $SiO_2$.

22. A mixer circuit according to claim 1, further including a low-pass filter disposed between said drain electrode and said output terminal.

23. A mixer circuit according to claim 1, further including a filter disposed between said first gate electrode and said first input terminal, for preventing the intermediate frequency signal mixed-down in said mixer circuit from leaking to the first input terminal.

24. A mixer circuit according to claim 1, further including a matching circuit, disposed between said second gate electrode of said dual gate FET and said second input terminal, for performing an input impedance matching operation for said second gate electrode of said dual gate FET.

25. A mixer circuit according to claim 2, further comprising a bias circuit for supplying said gate electrode of said single gate FET with a gate bias voltage such that a mutual conductance of said gate electrode of said single gate FET is unvaried even when a gate input voltage of said gate electrode of said single gate FET is varied.

26. A mixer circuit according to claim 4, further including a bias circuit for supplying said gate electrode of said single gate FET with a gate bias voltage such that a mutual conductance of said gate electrode of said single gate FET is unvaried even when a gate input voltage of said gate electrode of said single gate FET is varied.

27. A mixer circuit according to claim 1, further including a bias circuit for supplying said first gate electrode of said dual gate FET with a gate bias voltage in the vicinity of a pinch-off voltage of said first gate electrode of said dual gate FET.

28. A mixer circuit according to claim 1, further comprising a bias circuit for supplying said second gate electrode of said dual gate FET with a gate bias voltage such that a mutual conductance of said gate electrode is unvaried even when a gate input voltage of said gate electrode is varied.

29. A mixer circuit according to claim 2, further including a coupling capacitor disposed between said first gate electrode of said dual gate FET and said drain electrode of said single gate FET.

30. A mixer circuit according to claim 4, further including a coupling capacitor disposed between said second gate electrode of said dual gate FET and said drain electrode of said single gate FET.

31. A mixer circuit for mixing a local oscillation signal and a radio frequency signal, said mixer circuit comprising:
 a first input terminal to be supplied with the local oscillation signal;
 a second input terminal to be supplied with the radio frequency signal;
 a dual gate FET having:
  source and drain regions,
  a contact region located between said source and drain regions, said contact region being physically isolated from both of said source and drain regions,
  a pulse-doped layer connecting said source and drain regions,
  a first gate electrode located between said source and drain regions, said first gate electrode being connected to said first input terminal,
  a second gate electrode located between said first gate electrode and said source region, said second gate electrode being connected to said second input terminal, a minimum distance between said second gate electrode and said source region being shorter than a minimum distance between said first gate electrode and said drain region,
  a source electrode formed on said source region,
  a drain electrode formed on said drain region, and
  an insulating layer located between said first and second gate electrodes and covering a surface of said contact region; and
 an output terminal connected to said drain electrode, an intermediate frequency signal being made available via said output terminal in response to the local oscillation signal being applied to said first terminal and the radio frequency signal being applied to said second terminal.

32. A mixer circuit according to claim 31, further comprising a single gate FET with a pulse-doped structure, said singe gate FET being disposed between said first input terminal and said first gate electrode, said single gate FET having a gate electrode connected to said first input terminal and a drain electrode connected to said first gate electrode of said dual gate FET.

33. A mixer circuit according to claim 32, wherein said gate electrode of said single gate FET has a narrower gate width than said first gate electrode of said dual gate FET.

34. A mixer circuit according to claim 31, further including a single gate FET with a pulse-doped structure, said single gate FET being disposed between said second input terminal and said second gate electrode of said dual gate FET, said single gate FET having a gate electrode connected to said second input terminal, and a drain electrode connected to said second gate electrode of said dual gate FET.

35. A mixer circuit according to claim 34, wherein said gate electrode of said single gate FET has a narrower gate width than said second gate electrode of said dual gate FET.

36. A mixer circuit according to claim 31, further including:
 a first single gate FET with a pulse-doped structure, said first single gate FET being disposed between said first input terminal and said first gate electrode, said first single gate FET having a gate electrode connected to said first input terminal, and a drain electrode connected to said first gate electrode of said dual gate FET; and
 a second single gate FET with a pulse-doped structure, said second single gate FET being disposed between said second input terminal and said second gate electrode of said dual gate FET, said second single gate FET having a gate electrode connected to said second input terminal, and a drain electrode connected to said second gate electrode of said dual gate FET.

37. A mixer circuit according to claim 36, wherein
 said gate electrode of said first single gate FET has a narrower gate width than said first gate electrode of said dual gate FET, and
 said gate electrode of said second single gate FET has a narrower gate width than said second gate electrode of said dual gate FET.

38. A mixer circuit according to claim 31, wherein said source electrode is connected to ground.

39. A mixer circuit according to claim 32, wherein said source electrode is connected to ground.

40. A mixer circuit according to claim 34, wherein said source electrode is connected to ground.

41. A mixer circuit according to claim 36, wherein said source electrode is connected to ground.

42. A mixer circuit according to claim 31, wherein said pulse-doped layer is made of GaAs with Si as a dopant.

43. A mixer circuit according to claim 31, wherein said pulse-doped layer is made of n-type GaAs.

44. A mixer circuit according to claim 31, wherein said insulating layer is made of $SiO_2$.

45. A mixer circuit according to claim 31, further including a low-pass filter disposed between said drain electrode and said output terminal.

46. A mixer circuit according to claim 31, further including a filter disposed between said first gate electrode and said first input terminal, for preventing the intermediate frequency signal mixed-down in said mixer circuit from leaking to said first input terminal.

47. A mixer circuit according to claim 31, further including a matching circuit disposed between said second gate electrode of said dual gate FET and said second input terminal, for performing an input impedance matching operation for said second gate electrode of said dual gate FET.

48. A mixer circuit according to claim 32, further including a bias circuit for supplying said gate electrode of said single gate FET with a gate bias voltage such that a mutual conductance of said gate electrode of said single gate FET is unvaried even when a gate input voltage of said gate electrode of said single gate FET is varied.

49. A mixer circuit according to claim 34, further comprising a bias circuit for supplying said gate electrode of said single gate FET with a gate bias voltage such that a mutual conductance of said gate electrode of said single gate FET is unvaried even when a gate input voltage of said gate electrode of said single gate FET is varied.

50. A mixer circuit according to claim 31, further including a bias circuit for supplying said first gate electrode of said dual gate FET with a gate bias voltage in the vicinity of a pinch-off voltage of said first gate electrode of said dual gate FET.

51. A mixer circuit according to claim 31, further including a bias circuit for supplying said second gate electrode of said dual gate FET such that a mutual conductance of said second gate electrode is unvaried even when a gate input voltage of said second gate electrode is varied.

52. A mixer circuit according to claim 32, further including a coupling capacitor disposed between said first gate electrode of said dual gate FET and said drain electrode of said single gate FET.

53. A mixer circuit according to claim 34, further including a coupling capacitor disposed between said second gate electrode of said dual gate FET and said drain electrode of said single gate FET.

54. A mixer circuit according to claim 1, wherein a minimum distance between said second gate electrode and said source region is shorter than a minimum distance between said first gate electrode and said drain region.

\* \* \* \* \*

UNITED STATES PATENT AND TRADEMARK OFFICE
CERTIFICATE OF CORRECTION

PATENT NO. : 5,602,501
DATED : February 11, 1997
INVENTOR(S) : Nobuo SHIGA

It is certified that error appears in the above-indentified patent and that said Letters Patent is hereby corrected as shown below:

In the "Date of Patent" (item [45]), please change "[45] Date of Patent:  *Feb. 11, 1997" to --[45] Date of Patent:  Feb. 11, 1997--.

Please delete:
"[*] Notice:   The term of this patent shall not extend beyond the expiration date of Pat. No. 5,389,807."

Signed and Sealed this

Seventh Day of October, 1997

Attest:

BRUCE LEHMAN

Attesting Officer

Commissioner of Patents and Trademarks